United States Patent
Yoshimizu et al.

(10) Patent No.: US 11,211,267 B2
(45) Date of Patent: Dec. 28, 2021

(54) SUBSTRATE PROCESSING APPARATUS AND SUBSTRATE PROCESSING METHOD

(71) Applicant: TOSHIBA MEMORY CORPORATION, Tokyo (JP)

(72) Inventors: Yasuhito Yoshimizu, Yokkaichi Mie (JP); Hakuba Kitagawa, Yokkaichi Mie (JP); Takaumi Morita, Yokkaichi Mie (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/556,014

(22) Filed: Aug. 29, 2019

(65) Prior Publication Data

US 2020/0211864 A1    Jul. 2, 2020

(30) Foreign Application Priority Data

Dec. 27, 2018   (JP) .............................. JP2018-245620

(51) Int. Cl.
  *H01L 21/44*   (2006.01)
  *H01L 21/67*   (2006.01)
  *H01L 21/673*  (2006.01)
  *H01L 21/445*  (2006.01)

(52) U.S. Cl.
  CPC ........ *H01L 21/6715* (2013.01); *H01L 21/445* (2013.01); *H01L 21/673* (2013.01)

(58) Field of Classification Search
  CPC . H01L 21/6715; H01L 21/673; H01L 21/445; H01L 21/6708; H01L 21/67011

USPC ......................................................... 438/454
See application file for complete search history.

(56) References Cited

U.S. PATENT DOCUMENTS

| | | |
|---|---|---|
| 5,458,755 A | 10/1995 | Fujiyama |
| 6,103,096 A | 8/2000 | Datta et al. |
| 2003/0024826 A1 | 2/2003 | Yahalom et al. |
| 2003/0056901 A1* | 3/2003 | Nakano ............. H01J 37/32082 156/345.47 |
| 2004/0147113 A1* | 7/2004 | Yamazaki ............. H01L 21/288 438/660 |
| 2004/0188244 A1 | 9/2004 | Sato et al. |
| 2004/0234678 A1* | 11/2004 | Hirai ..................... H01L 21/288 427/58 |
| 2005/0241769 A1* | 11/2005 | Satoyoshi ......... H01J 37/32183 156/345.44 |
| 2006/0234508 A1* | 10/2006 | Shirakashi ........ H01L 21/67173 438/691 |
| 2007/0181181 A1 | 8/2007 | Mizusawa |

(Continued)

FOREIGN PATENT DOCUMENTS

| | | |
|---|---|---|
| JP | H01-139797 A | 6/1989 |
| JP | H09-217200 A | 8/1997 |

(Continued)

*Primary Examiner* — Sheikh Maruf
(74) *Attorney, Agent, or Firm* — Foley & Lardner LLP

(57) ABSTRACT

According to one embodiment, a substrate processing apparatus includes a table configured to place a substrate thereon and to connect the substrate to a positive electrode, an counter electrode located opposite to the table, having a plurality of holes, and connected to a negative electrode, and a holding unit located opposite to the table across the counter electrode and configured to supply a chemical liquid to the counter electrode while holding the counter electrode.

12 Claims, 8 Drawing Sheets

(56) References Cited

U.S. PATENT DOCUMENTS

| | | | |
|---|---|---|---|
| 2008/0171444 A1* | 7/2008 | Dhindsa | H01J 37/32568 438/729 |
| 2009/0020434 A1* | 1/2009 | Susaki | H01L 21/67051 205/239 |
| 2009/0126634 A1* | 5/2009 | Yamazawa | C23C 16/5096 118/723 R |
| 2009/0159588 A1* | 6/2009 | Morioka | H01L 21/67103 219/444.1 |
| 2010/0116788 A1* | 5/2010 | Singh | C23C 16/52 216/66 |
| 2010/0119843 A1* | 5/2010 | Sun | H01J 37/32477 428/426 |
| 2010/0177454 A1* | 7/2010 | Elliot | H01L 21/67109 361/234 |
| 2010/0243609 A1* | 9/2010 | Yamazawa | H01J 37/3255 216/71 |
| 2010/0314356 A1* | 12/2010 | Nagayama | H01J 37/32467 216/52 |
| 2011/0174441 A1* | 7/2011 | Yamashita | C23C 16/4404 156/345.38 |
| 2012/0141661 A1* | 6/2012 | Cho | H01L 21/6833 427/58 |
| 2012/0299253 A1* | 11/2012 | Kosakai | H01L 21/67103 279/128 |
| 2013/0153116 A1* | 6/2013 | Hirakawa | H01L 21/67748 156/64 |
| 2013/0224675 A1* | 8/2013 | Park | F27D 5/0037 432/253 |
| 2013/0277710 A1* | 10/2013 | Hirler | H01L 29/66712 257/139 |
| 2014/0159325 A1* | 6/2014 | Parkhe | H01J 37/32715 279/128 |
| 2014/0203526 A1* | 7/2014 | Banda | B28D 5/0082 279/128 |
| 2014/0374871 A1* | 12/2014 | Hirabayashi | H01L 29/7397 257/488 |
| 2015/0303260 A1* | 10/2015 | Niedemostheide | H01L 29/0834 257/139 |
| 2015/0333133 A1* | 11/2015 | Boettcher | H01L 29/063 257/488 |
| 2016/0141204 A1* | 5/2016 | Kawahara | H01L 29/4916 257/330 |
| 2016/0149007 A1* | 5/2016 | Chou | H01L 29/402 257/339 |
| 2016/0190265 A1* | 6/2016 | Lee | H01L 29/78 257/331 |
| 2018/0265989 A1 | 9/2018 | Yoshimizu | |
| 2019/0013230 A1* | 1/2019 | Taga | H01L 21/67109 |

FOREIGN PATENT DOCUMENTS

| | | |
|---|---|---|
| JP | 3217586 B2 | 10/2001 |
| TW | 541227 B | 7/2003 |
| TW | 541609 B | 7/2003 |
| TW | I221862 B | 10/2004 |
| TW | I397112 | 5/2013 |
| TW | M545356 U | 7/2017 |

* cited by examiner

SUBSTRATE PROCESSING APPARATUS AND SUBSTRATE PROCESSING METHOD

CROSS-REFERENCE TO RELATED APPLICATION(S)

This application is based upon and claims the benefit of priority from Japanese Patent Application No. 2018-245620, filed Dec. 27, 2018, the entire contents of which are incorporated herein by reference.

FIELD

Embodiments described herein relate generally to a substrate processing apparatus and a substrate processing method.

BACKGROUND

One of known substrate processing methods includes a process of performing, on a substrate, processing, such as etching or oxidizing a metallic film formed on the substrate, in a state in which an electric field is applied to the substrate.

An example of related art includes Japanese Patent No. 3,217,586.

DETAILED DESCRIPTION

Embodiments provide a substrate processing apparatus and a substrate processing method each of which is more adapted for performing processing of a metallic film.

In general, according to one embodiment, a substrate processing apparatus includes a support structure configured to connect a substrate to a positive electrode of a direct-current power source, an counter electrode located opposing the support structure, that includes a plurality of holes and is connected to a negative electrode of the direct-current power source, and a holder, located opposing to the support structure and over the counter electrode, that is configured to supply a chemical liquid to the counter electrode while holding the counter electrode.

Hereinafter, embodiments of the present disclosure will be described with reference to the drawings. The following embodiments are not intended to limit the present disclosure.

First Embodiment

Figure 1:
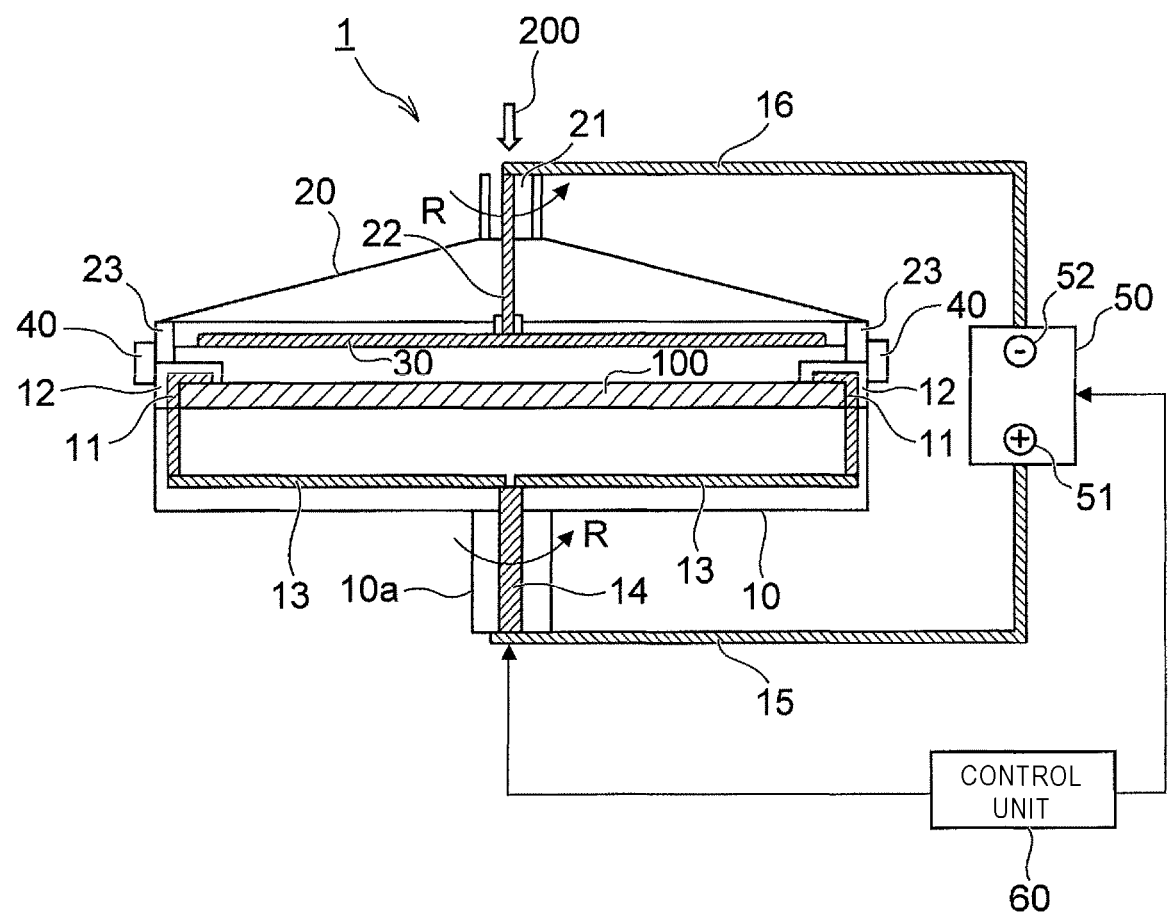
FIG. 1 is a schematic diagram illustrating an outline configuration of a substrate processing apparatus according to a first embodiment.
Figure 2A:
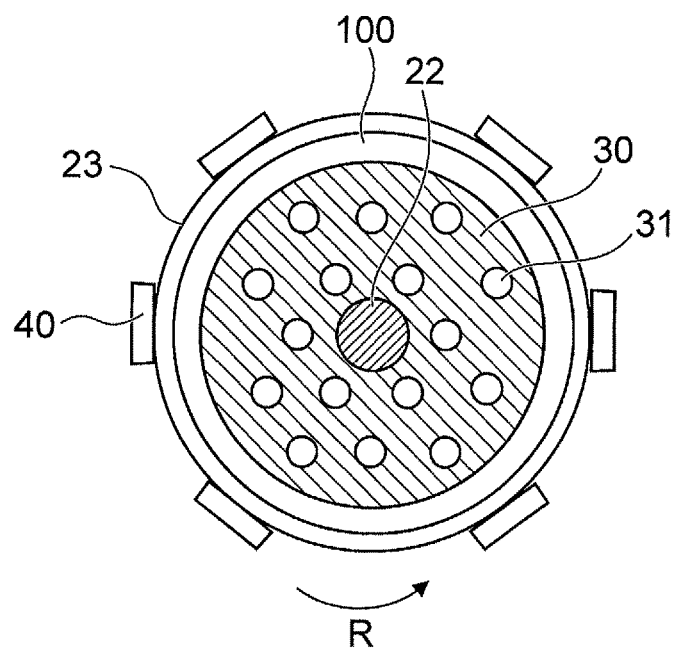
FIG. 2A is an outline plan view of an upper portion of the substrate processing apparatus illustrated in FIG. 1.
Figure 2B:
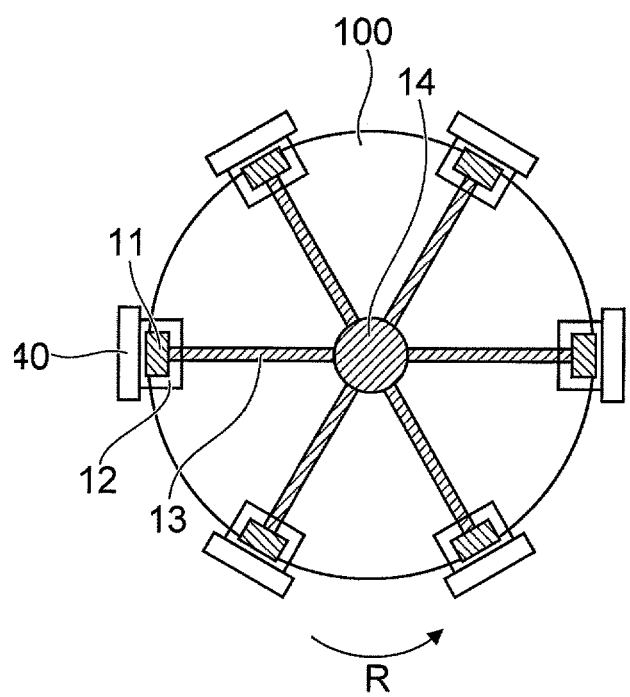
FIG. 2B is an outline plan view of a lower portion of the substrate processing apparatus.

FIG. 1 is a schematic diagram illustrating an outline configuration of a substrate processing apparatus according to a first embodiment. Moreover, FIG. 2A is an outline plan view of an upper portion of the substrate processing apparatus illustrated in FIG. 1. FIG. 2B is an outline plan view of a lower portion of the substrate processing apparatus illustrated in FIG. 1. A substrate processing apparatus 1 according to the present embodiment includes a rotating table 10, a head 20, an counter electrode 30, fixing jigs 40, a direct-current power source 50, and a control unit 60.

As illustrated in FIG. 1, a wafer-shaped substrate 100 is placed on the rotating table 10. The rotating table 10 is rotatable in the rotation direction R around a rotation shaft 10a. A plurality of conductive pins 11 electrically connected to conducting wires 13 described below is provided on the rotating table 10.

The plurality of pins 11 is arranged in a dispersed manner along the rotation direction R as illustrated in FIG. 2B and is in contact with the outer circumferential portions of the substrate 100. The substrate 100 is fixed to the rotating table 10 by the plurality of pins 11. Each pin 11 is covered with an edge grip 12 in such a way as not to come into contact with a chemical liquid 200. It is desirable that the material of the edge grip 12 be a material having corrosion resistance and insulation performance with respect to the chemical liquid 200, such as Teflon®. Furthermore, the method of fixing the substrate 100 is not limited to the method of fixing the outer circumferential portions of the substrate 100 with the plurality of pins 11 as in the present embodiment. The fixing measure may be located at such a position as not to come into contact with the counter electrode 30, for example, on the reverse surface of the substrate 100. Each pin 11, for example, the fore-end thereof, is connected to a film (for example, a semiconductor or metal) formed on the substrate 100 or the obverse surface of the substrate 100.

Conducting wires 13 and a conducting wire 14 are provided in the rotating table 10. The conducting wires 13 and the conducting wire 14 electrically connect the plurality of pins 11 to a positive electrode 51 of the direct-current power source 50. Therefore, the potential of the substrate 100 is the same as the potential of the positive electrode 51. As illustrated in FIG. 1 and FIG. 2B, in the present embodiment, one end of each of the plurality of conducting wires 13 is connected to the associated one of the plurality of pins 11. The other ends of the respective conducting wires 13 are bundled together to form the conducting wire 14 in the rotation shaft 10a. The conducting wire 14 is connected to the positive electrode 51 of the direct-current power source 50 via a conducting wire 15. In this way, the substrate 100 is connected to the direct-current power source 50 via the pins 11, the conducting wires 13, the conducting wire 14, and the conducting wire 15. Furthermore, a coupling portion (not illustrated) is provided between the conducting wire 14 and the conducting wire 15. The coupling portion causes the conducting wire 14 to be rotatably coupled to the conducting wire 15, which is in a stationary condition. The coupling portion may be provided between the conducting wires 13 and the conducting wire 14.

The head 20 functions as a liquid supply unit of the shower shape having a plurality of liquid passage holes. The head 20 rotates in synchronization with the rotating table 10 at a position facing the rotating table 10. An opening 21 is provided at the top portion of the head 20. A conducting wire 22, which is electrically connected to the counter electrode 30, is provided inside the head 20. In the present embodiment, the center of the opening 21 coincides with the axis of the rotation shaft 10a of the rotating table 10. A chemical liquid 200, which is used to process the substrate 100, flows into the opening 21. Moreover, the conducting wire 22 is connected to a negative electrode 52 of the direct-current power source 50 via a conducting wire 16. In this way, the counter electrode 30 is connected to the direct-current power source 50 via the conducting wire 22 and the conducting wire 16. Furthermore, a coupling portion (not illustrated) is provided between the conducting wire 22 and the conducting wire 16. The coupling portion causes the conducting wire 22 to be rotatably coupled to the conducting wire 16, which is in a stationary condition. The coupling portion can be provided between the conducting wire 22 and the counter electrode 30.

The chemical liquid 200 to be used includes, for example, acid, alkali, oxidant, salt, and organic solvent. Specifically, examples of the chemical liquid 200 include sulfuric acid, nitric acid, phosphoric acid, hydrochloric acid, hydrofluoric acid, acetic acid, formic acid, hydrogen peroxide solution, ozone water, ammonium persulfate, ammonium solution, sodium chloride, aqueous sodium hydroxide, potassium hydroxide solution, tetrahydroxy ammonium halide, and choline.

Since the above-mentioned chemical liquids are highly corrosive, it is desirable that the material of the head 20 be insulating resin, such as polytetrafluoroethylene (PTFE) or polychlorotrifluoroethylene (PCTFE). Moreover, it is also desirable that the conducting wire 22 be covered with such insulating resin.

An annular guide 23 is provided at a lower portion of the head 20 along the outer circumference of the head 20. The guide 23 enables preventing the chemical liquid 200 from being scattered when the head 20 is rotating. Moreover, the guide 23 is placed on the edge grips 12 as illustrated in FIG. 1, and is, therefore, able to determine the position of the head 20. Since the counter electrode 30 is held by the head 20, the position of the head 20 being fixed stabilizes the distance between the substrate 100 and the counter electrode 30. The distance between the substrate 100 and the counter electrode 30 is, for example, 1 mm or more, and the substrate 100 and the counter electrode 30 are provided at such respective positions as not to come into complete contact with each other.

The counter electrode 30 is located at the lower portion of the head 20 and is held by the head 20. Thus, the head 20 also functions as a holding unit which holds the counter electrode 30. The circumference of the counter electrode 30 is surrounded by the guide 23. The counter electrode 30 contains, for example, at least one of conductive carbon, platinum (Pt), gold (Au), silver (Ag), and palladium (Pd), and is formed into a plate in the shape of, for example, a circle. Alternatively, the counter electrode 30 may be made from a carbon material covered with a noble metal film or from a graphene nanosheet having defects. As illustrated in FIG. 2A, the counter electrode 30 has a plurality of hole-shaped liquid passage ports 31, through which the chemical liquid 200 passes.

Moreover, the counter electrode 30 is electrically connected to the conducting wire 22. The conducting wire 22 is connected to the negative electrode 52 of the direct-current power source 50. Therefore, the potential of the counter electrode 30 is the same as that of the negative electrode 52. Thus, the counter electrode 30 is lower in potential than the substrate 100.

The fixing jigs 40 fix the head 20 to the rotating table 10. In the present embodiment, the fixing jigs 40 fix the head 20 and the rotating table 10 to each other at contact portions between the guide 23 and the edge grips 12. Furthermore, the fixing method by the fixing jigs 40 is not particularly limited. For example, the fixing jigs 40 may be fitted onto the guide 23 and each of the edge grips 12.

The direct-current power source 50 includes the positive electrode 51, which is electrically connected to the substrate 100, and the negative electrode 52, which is electrically connected to the counter electrode 30. When the direct-current power source 50 is turned on by receiving an applied voltage, an electric field is generated between the substrate 100 and the counter electrode 30, so that a corrosion current flows to the substrate 100 via the chemical liquid 200.

The control unit 60 controls, for example, a rotational operation for the rotating table 10, a turning-on operation for the direct-current power source 50, and a supply operation for the chemical liquid 200. Furthermore, the control unit 60 may be configured as a unit located outside the substrate processing apparatus 1.

Figure 3A:
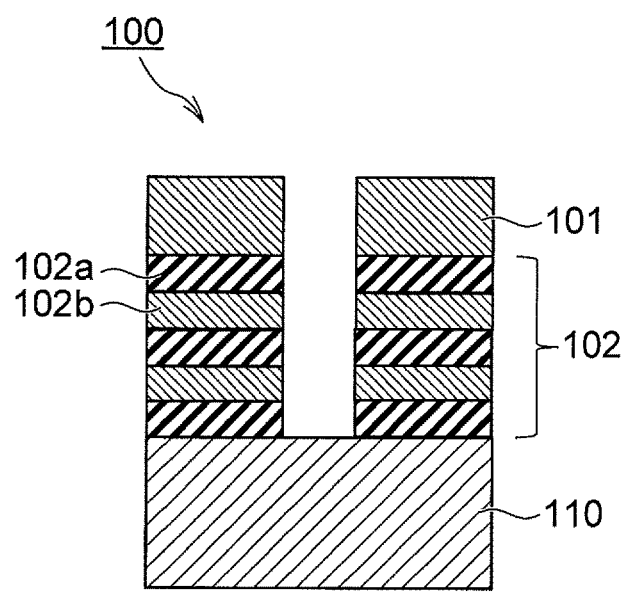
FIG. 3A illustrates a state of a substrate obtained before processing is performed thereon.
Figure 3B:
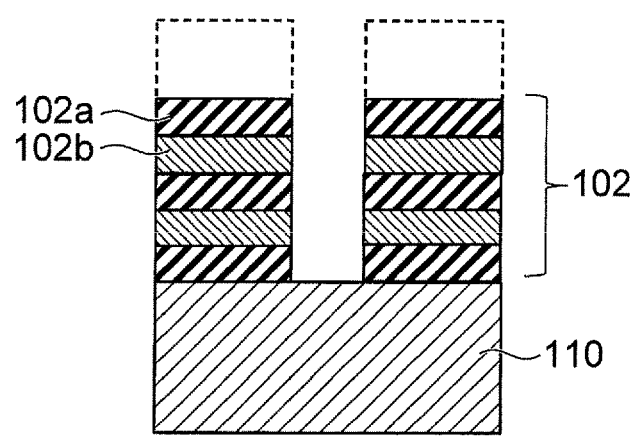
FIG. 3B illustrates a state of the substrate obtained after processing is performed thereon.

Next, an example of a configuration of the substrate 100, which is a processing object, is described with reference to FIG. 3A and FIG. 3B. FIG. 3A illustrates a state of the substrate 100 obtained before processing is performed thereon, and FIG. 3B illustrates a state of the substrate 100 obtained after processing is performed thereon.

As illustrated in FIG. 3A, in the substrate 100 obtained before processing is performed thereon, a metallic film 101 is provided. The metallic film 101 is provided on a stacked body 102. The stacked body 102 is provided on a semiconductor substrate 110, which contains, for example, silicon. The metallic film 101 is a mask formed on the stacked body 102 so as to form a pattern (in the present embodiment, a slit which penetrates through the stacked body 102) on the stacked body 102, and contains, for example, tungsten.

In the present embodiment, the pattern of the stacked body 102 is formed by, for example, performing etching with a pattern formed on the metallic film 101 used as a mask. The metallic film 101 is removed by the substrate processing apparatus 1 performing etching processing, as illustrated in FIG. 3B.

The stacked body 102 includes insulating films 102a and conductive films 102b alternately arranged one by one. The insulating film 102a contains, for example, silicon dioxide ($SiO_2$). The conductive film 102b contains tungsten, as with the metallic film 101. The conductive film 102b may be used as, for example, a word line in a three-dimensional memory. Furthermore, the structure of the substrate 100 is not limited to the above-mentioned structure.

Moreover, the use application of the substrate processing apparatus 1 is also not limited to the above-mentioned etching to be performed on the metallic film 101. The substrate processing apparatus 1 may also be used for a process of detaching a conductive film (not illustrated) formed on a substrate, a process of forming holes in a substrate, or a process of forming holes made from aluminum oxide by performing oxidation treatment on an aluminum thin film formed on a substrate. These various use applications can be controlled based on, for example, at least one of a condition for a film formed on the substrate 100, a condition for the chemical liquid 200, and a condition for application of a voltage.

Figure 4:
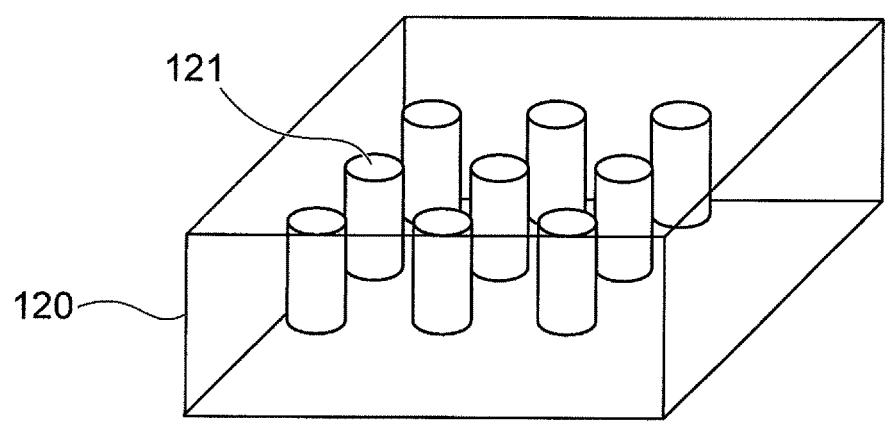
FIG. 4 is a perspective view illustrating an example in which holes are formed in a substrate.

FIG. 4 is a perspective view illustrating an example in which hole are formed in a substrate. In FIG. 4, the substrate processing apparatus 1 according to the present embodiment is used to locally generate a corrosion current with respect to a substrate 120. This causes holes 121 to be formed. Each hole 121 is open at the surface of the substrate 120, and extends toward the inside of the substrate 120.

Figure 5A:
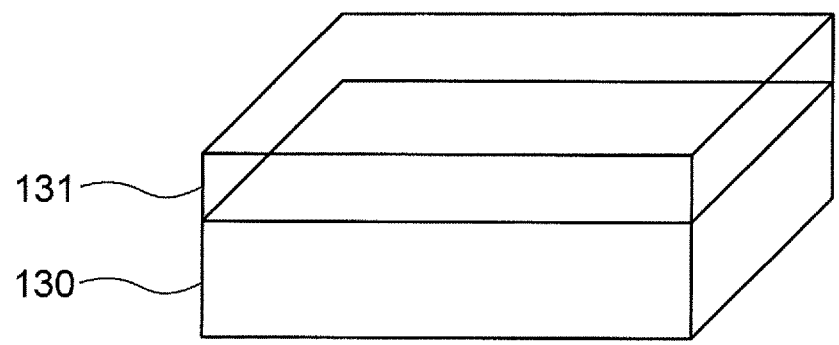
FIG. 5A is a perspective view illustrating a state obtained before holes are formed in an aluminum oxide film.
Figure 5B:
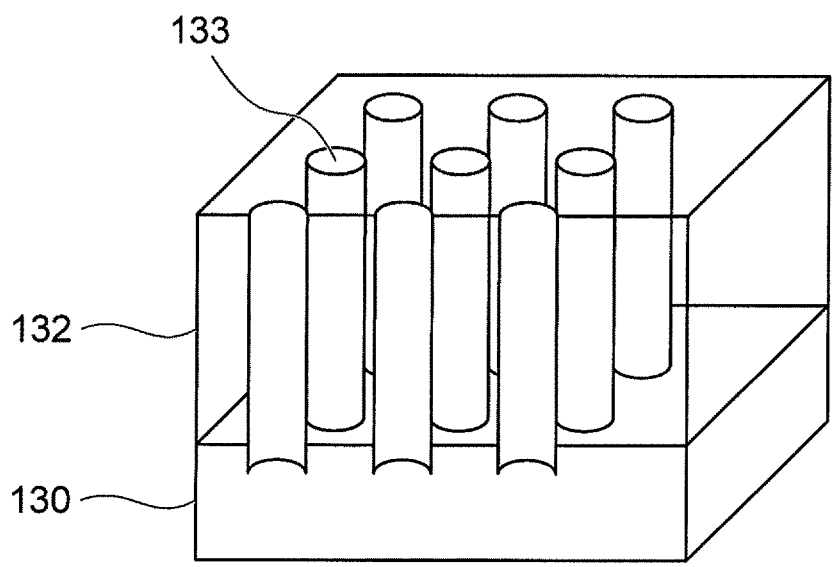
FIG. 5B is a perspective view illustrating a state obtained after holes are formed in the aluminum oxide film.

FIG. 5A is a perspective view illustrating a state obtained before holes, made of aluminum oxide, are formed. FIG. 5B is a perspective view illustrating a state obtained after the holes, made of aluminum oxide, are formed. In FIG. 5A, an aluminum thin film 131 is formed on a substrate 130, which is a silicon substrate. The substrate processing apparatus 1 according to the present embodiment is used to locally generate a corrosion current with respect to the aluminum thin film 131. This causes the aluminum thin film 131 to be oxidized, so that the aluminum thin film 131 grows to an aluminum oxide film 132. At the same time, while a local electric field is generated within the surface of the aluminum thin film 131, the chemical liquid 200 supplied to the aluminum thin film 131 enables dissolving the oxidized aluminum thin film 131. Repeating this process causes a plurality of holes 133 to be formed in the aluminum oxide film 132. In this method, the chemical liquid 200 may be used under the condition of containing an acid capable of dissolving aluminum oxide, or a voltage application condition may be set as appropriate in such a manner that holes 133 are formed at a desired pitch.

The above-mentioned holes 133, in other words, positive electrode oxidation holes, can be applied to, for example, a storage element. When a magnetic thin film is formed in the positive electrode oxidation hole by a chemical vapor deposition (CVD) method, a cylindrical magnetic body is obtained. Causing an electric current to flow from above or below the magnetic body enables performing an operation acting as a storage element, such as write, storing, and read, while shifting magnetization information in the tube up and down.

In the following description, a substrate processing method using the substrate processing apparatus 1 according to the present embodiment is described. Here, the substrate processing method is described with an etching process for the metallic film 101 illustrated in FIG. 3A taken as an example.

First, the method fixes the substrate 100 to the rotating table 10 with a plurality of pins 11. This causes the substrate 100 to be electrically connected to the positive electrode 51 of the direct-current power source 50 via the conducting wires 13.

Next, the method moves the head 20 down to a position in which the guide 23 comes into contact with the edge grips 12. Then, the method fixes the head 20 to the rotating table 10 with the fixing jigs 40. This enables keeping the distance between the counter electrode 30 and the substrate 100 stable.

Next, the method introduces the chemical liquid 200 from the opening 21 into the head 20. The introduced chemical liquid 200 is supplied from the liquid passage ports 31 of the counter electrode 30 to the substrate 100 via the head 20. Then, the method rotates the rotating table 10 concurrently with supplying of the chemical liquid 200. Moreover, the method starts supplying of an electric current from the direct-current power source 50. This supplying of an electric current causes an electric field to be generated in the chemical liquid 200 situated between the substrate 100 and the counter electrode 30. As a result, a corrosion current flows through the substrate 100, so that etching for the metallic film 101 is accelerated.

According to the present embodiment as described above, supplying of an electric current from the direct-current power source 50 causes an electric field to be generated between the substrate 100, which serves as an anode, and the counter electrode 30, which serves as a cathode. This causes a voltage to be applied to the chemical liquid 200 supplied from the counter electrode 30, and, therefore, enables increasing a reaction rate for etching or oxidation.

Since the chemical liquid 200 is supplied from the shower-shaped head 20 to the counter electrode 30, it is possible to supply a desired amount of chemical liquid to a desired range. Moreover, since the liquid passage ports 31 are provided on the counter electrode 30, it is possible to directly supply the chemical liquid 200, introduced from the opening 21, from the counter electrode 30 to the substrate 100. Therefore, the counter electrode 30 is able to be located in a lower portion of the head 20, so that the counter electrode 30 becomes able to be made close to the substrate 100 without limit. As the distance between the counter electrode 30 and the substrate 100 becomes smaller, a voltage is more efficiently applied to the chemical liquid 200. As a result, it is possible to reduce the output voltage of the direct-current power source 50 and increase the reaction efficiency.

Additionally, when the chemical liquid 200 is being supplied from the counter electrode 30 to the substrate 100, the head 20 rotates in synchronization with the rotating table 10. Therefore, since the flow rate of the chemical liquid 200 increases, it is possible to further increase the reaction rate for etching or oxidation.

Second Embodiment

Figure 6:
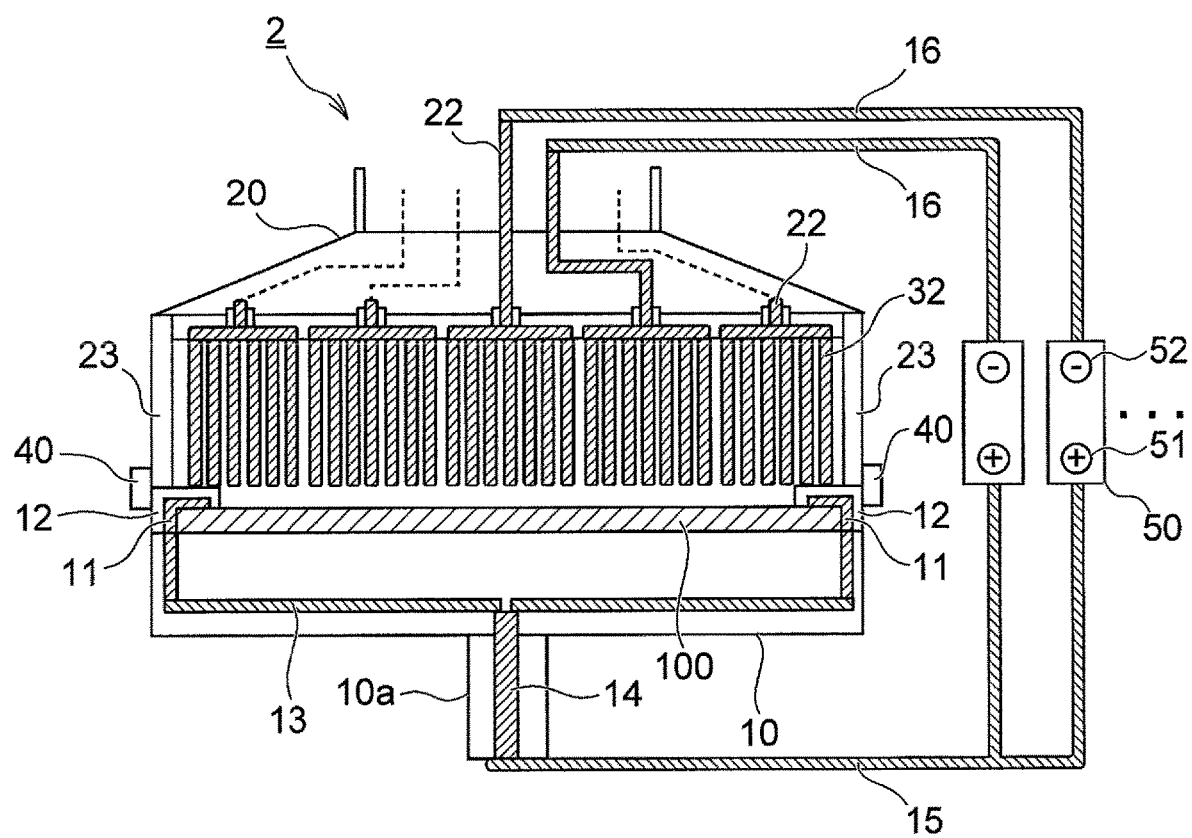
FIG. 6 is a schematic diagram illustrating an outline configuration of a substrate processing apparatus according to a second embodiment.

FIG. 6 is a schematic diagram illustrating an outline configuration of a substrate processing apparatus according to a second embodiment. Constituent elements similar to those of the above-described first embodiment are assigned the respective same reference characters, and the detailed description thereof is omitted.

In a substrate processing apparatus 2 according to the present embodiment, the counter electrode 30 of the substrate processing apparatus 1 according to the first embodiment is configured with a plurality of capillary bodies 32. In other words, the substrate processing apparatus 2 includes, instead of the flat-plate counter electrode 30, a plurality of capillary counter electrodes. Hereinafter, such an counter electrode is described as a capillary body 32. As illustrated in FIG. 6, conducting wires 22 are individually connected to the plurality of capillary bodies 32. The conducting wires are electrically connected to the respective negative electrodes 52 of a plurality of direct-current power sources 50 via the respective conducting wires 16. On the other hand, the substrate 100 is electrically connected to the positive electrodes 51 of the plurality of direct-current power sources 50 via the conducting wires 13, the conducting wire 14, and the conducting wire 15 in common.

Figure 7:
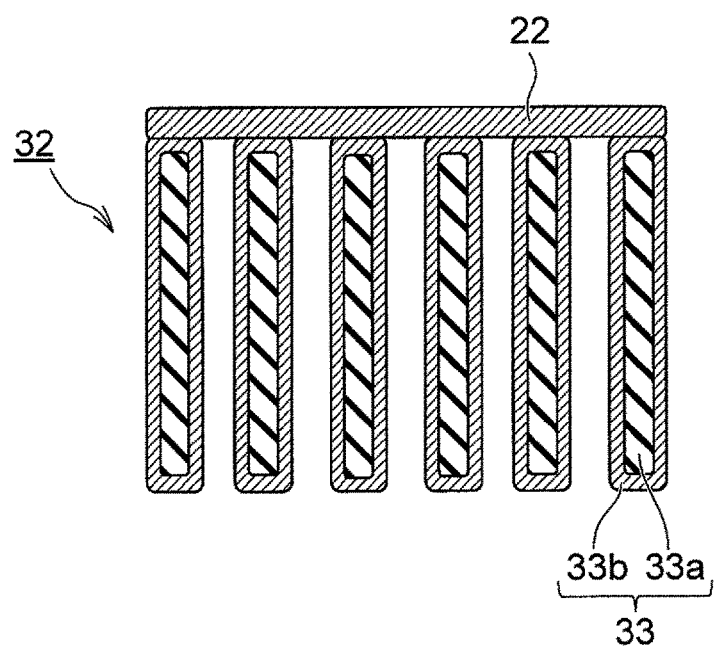
FIG. 7 is an enlarged sectional view of a capillary body.

FIG. 7 is an enlarged sectional view of the capillary body 32. The capillary body 32 is an aggregate obtained by bundling together a plurality of capillary bodies 33 extending from the head 20 toward the substrate 100. Each capillary body 33 includes an insulator 33a serving as a core portion. The insulator 33a is covered with a noble metal film 33b. The insulator 33a contains, for example, polypropylene, and the noble metal film 33b contains, for example, a noble metal such as platinum. The capillary body 32 may be made from a conductive carbon material.

Furthermore, the structure of the capillary body 33 is not limited to the above-mentioned structure. For example, the noble metal film 33b may partially cover the insulator 33a or to cover the entire insulator 33a. Moreover, the insulator 33a may be covered with nanoparticles made of a noble metal.

According to the present embodiment, as with the first embodiment, when the chemical liquid 200 is being supplied from the liquid passage ports 31 of the counter electrode 30 while the rotating table 10 is rotated, electric currents are supplied from the respective direct-current power sources 50. At this time, in the present embodiment, in addition to the counter electrode 30, each capillary body 32 also serves as a cathode. This makes the surface area of a portion contacting the chemical liquid 200 larger, thus activating a reaction between the chemical liquid 200 and the substrate 100.

Moreover, according to the present embodiment, individually adjusting the output voltages of the respective direct-current power sources 50 enables controlling cathode potentials. Therefore, for example, when unevenness of etching occurs in the substrate 100, individually adjusting the output voltages of the respective direct-current power sources 50 enables performing uniform processing in the substrate 100.

Furthermore, in the present embodiment, the number of conducting wires 13 on the anode side is not limited. As with the conducting wires 22 on the cathode side, a plurality of conducting wires 13 may be away from each other in the rotating table 10. In this case, since it is possible to control the anode potentials, it is possible to locally activate a reaction with respect to the substrate 100.

Third Embodiment

Figure 8:
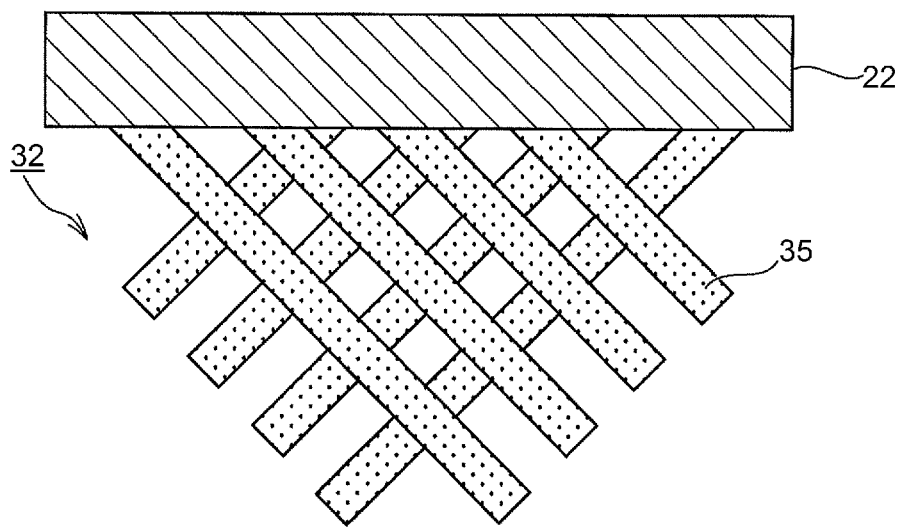
FIG. 8 is an outline sectional view of relevant portions of a substrate processing apparatus according to a third embodiment.

In the following description, a third embodiment is described. FIG. 8 is an outline sectional view of relevant portions of a substrate processing apparatus according to a third embodiment. Constituent elements similar to those of the above-described second embodiment are assigned the respective same reference characters, and the detailed description thereof is omitted.

In the substrate processing apparatus according to the present embodiment, as illustrated in FIG. 8, a plurality of reticular bodies 34 is provided as an counter electrode. The upper end portions of the plurality of reticular bodies 34 are connected to the conducting wires 22 at the lower portion of the head 20 as with the capillary bodies 32. In each reticular body 34, for example, string-shaped pieces of conductive carbon 35 are processed into a net-like (mesh-like) shape.

According to the present embodiment, as with the second embodiment, when the chemical liquid 200 is being supplied from the liquid passage ports 31 of the counter electrode 30 via the head 20 while the rotating table 10 is rotated, electric currents are supplied from the respective direct-current power sources 50. At this time, in the present embodiment, each reticular body 34 serves as a cathode. This makes the surface area of a portion contacting the chemical liquid 200 larger, thus activating a reaction between the chemical liquid 200 and the substrate 100.

Moreover, according to the present embodiment, as with the second embodiment, individually adjusting the output voltages of the respective direct-current power sources 50 also enables controlling cathode potentials. Therefore, for example, when unevenness of etching occurs in the substrate 100, individually adjusting the output voltages of the respective direct-current power sources 50 enables performing uniform processing in the substrate 100.

Fourth Embodiment

Figure 9:
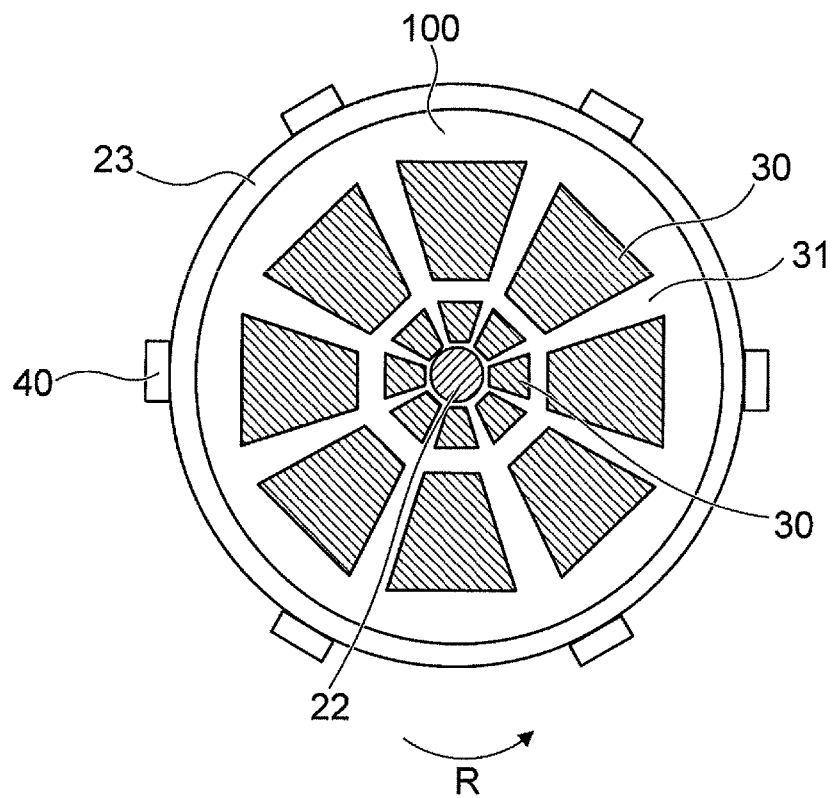
FIG. 9 is an outline plan view of a substrate processing apparatus according to a fourth embodiment.

FIG. 9 is an outline plan view of an upper portion of a substrate processing apparatus according to a fourth embodiment. Constituent elements similar to those of the substrate processing apparatuses according to the above-described first embodiment to third embodiment are assigned the respective same reference characters, and the detailed description thereof is omitted.

In the substrate processing apparatus according to the present embodiment, as illustrated in FIG. 9, a plurality of flat-plate counter electrodes 30 is dispersedly arranged in a radial fashion from a conducting wire 22 located on the rotation center. Moreover, liquid passage ports 31 are formed between the counter electrodes 30. Furthermore, the shape of each counter electrode 30 may be the capillary body 32 (see FIG. 7) described in the second embodiment or the reticular body 34 (see FIG. 8) described in the third embodiment.

Figure 10:
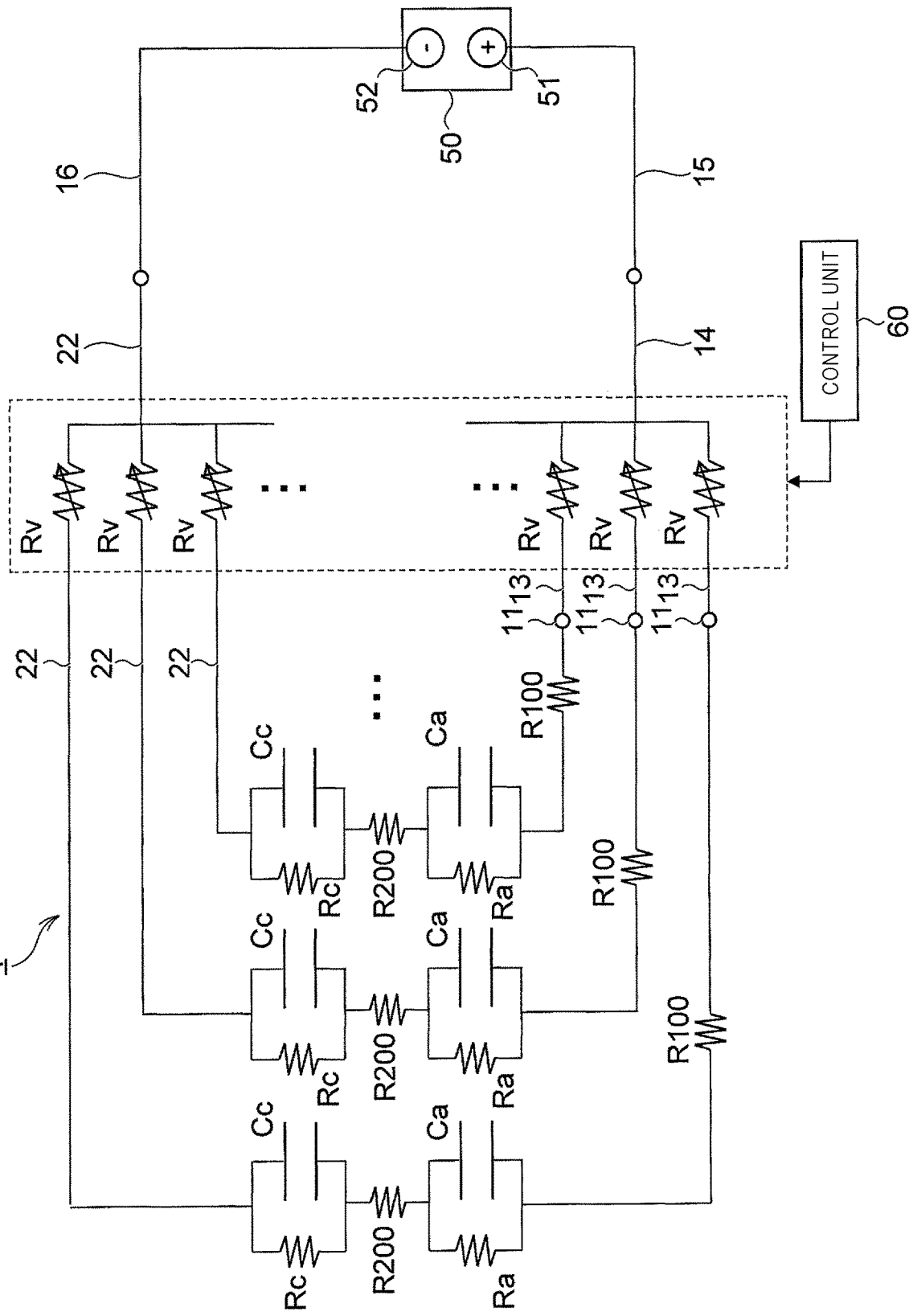
FIG. 10 is a diagram illustrating an example of a corrosion circuit in the substrate processing apparatus according to the fourth embodiment.

FIG. 10 is a diagram illustrating an example of a corrosion circuit in a substrate processing apparatus 4 according to the fourth embodiment. In the circuit diagram illustrated in FIG. 10, variable resistors Rv are connected to respective ones of the conducting wires 22 and the conducting wires 13. The resistance value of each variable resistor Rv is controlled by the control unit 60.

In the present embodiment, on a current pathway from the positive electrode 51 to the negative electrode 52, there exist, in addition to the variable resistors Rv, resistors R100, anode resistors Ra, chemical liquid resistors R200, and cathode resistors Rc. The resistors R100 correspond to the resistance of a processing object, i.e., the substrate 100. The chemical liquid resistors R200 correspond to the resistance of the chemical liquid 200.

The anode resistors Ra correspond to the resistance of an interface between the substrate 100 and the chemical liquid 200. On this interface, there also exist anode capacitances Ca connected in parallel to the respective anode resistances Ra. The cathode resistors Rc correspond to the resistance of an interface between the counter electrode 30 and the chemical liquid 200. On this interface, there also exist capacitances Cc connected in parallel to the respective cathode resistances Rc.

In the corrosion circuit configured as described above, if the corrosion current varies, a variation in the rate of oxidation or dissolution of a processing object occurs. Therefore, in the present embodiment, the control unit 60 is able to locally adjust at least one of the current and voltage of the corrosion circuit by controlling the resistance values of the variable resistors Rv. This enables making the corrosion current in the substrate 100 uniform.

According to the present embodiment, as with the above-described other embodiments, when the chemical liquid 200 is being supplied from the liquid passage ports 31 while the rotating table 10 is rotated, an electric current is supplied from the direct-current power source 50. Since the liquid passage ports 31 are formed at respective spaces between the counter electrodes 30, the counter electrodes 30 are able to be located in a lower portion of the head 20. This enables locating the counter electrodes 30 near the substrate 100. As a result, even if the output voltage of the direct-current power source 50 is low, it is possible to increase the reaction efficiency.

Moreover, in the present embodiment, individually adjusting the resistance values of the variable resistors Rv enables controlling the cathode potentials. Therefore, for example, when a variation in processing occurs between the central portion of the substrate 100 and the peripheral portion thereof, it is possible to perform uniform processing in the substrate 100 by adjusting supplying of electric currents to the counter electrodes 30 facing the respective portions of the substrate 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A substrate processing apparatus comprising:
   a support structure configured to connect a substrate to a positive electrode of a direct-current power source;
   a counter electrode, located opposing the support structure, that includes a plurality of holes, and is connected to a negative electrode of the direct-current power source;
   a holder having a liquid passage hole, wherein the holder is located opposing the support structure and over the counter electrode and configured to supply a chemical liquid to the counter electrode while holding the counter electrode;
   an edge grip provided on and along an outer peripheral of the support structure, the edge grip being in contact with the support structure; and
   a guide provided at a lower portion and along an outer circumference of the holder.

2. The substrate processing apparatus according to claim 1, wherein the support structure and the holder rotate in synchronization with each other.

3. The substrate processing apparatus according to claim 1, wherein a shape of the counter electrode is a plate or plate-like.

4. The substrate processing apparatus according to claim 1, wherein the counter electrode is a capillary body with one end connected to the holder or a reticular body having a plurality of pieces formed in a mesh-like shape.

5. The substrate processing apparatus according to claim 1, wherein the substrate and the counter electrode are not in contact with each other.

6. The substrate processing apparatus according to claim 4,
   wherein either the capillary body or the reticular body includes a plurality of counter electrodes, and
   wherein the plurality of counter electrodes is arranged in a rotational direction on the holder.

7. The substrate processing apparatus according to claim 4,
   wherein the capillary body, extending from the holder to the substrate, that includes an insulator core covered by a noble metal film.

8. The substrate processing apparatus according to claim 1, wherein the edge grip and the guide are configured to contact each other.

9. The substrate processing apparatus according to claim 1, wherein the counter electrode is a plurality of capillary bodies, each of the capillary bodies having one end connected to the holder and extending toward the substrate.

10. The substrate processing apparatus according to claim 9, wherein each of the capillary bodies includes an insulator core covered by a noble metal film.

11. The substrate processing apparatus according to claim 1, wherein the counter electrode includes a plurality of reticular bodies, each of the reticular bodies having a plurality of pieces formed in a mesh-like shape.

12. The substrate processing apparatus according to claim 1, wherein the guide is provided above the edge grip.

* * * * *